(12) United States Patent
Yagi et al.

(10) Patent No.: US 10,383,269 B2
(45) Date of Patent: *Aug. 13, 2019

(54) ELECTRONIC COMPONENT MOUNTING SYSTEM AND ELECTRONIC COMPONENT MOUNTING METHOD

(71) Applicant: PANASONIC INTELLECTUAL PROPERTY MANAGEMENT CO., LTD., Osaka (JP)

(72) Inventors: Shuzo Yagi, Yamanashi (JP); Takashi Tamura, Yamanashi (JP); Hiroki Yamamoto, Yamanashi (JP); Toru Ikeda, Yamanashi (JP); Kazuhiro Kishikawa, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 4 days.

This patent is subject to a terminal disclaimer.

(21) Appl. No.: 15/610,893

(22) Filed: Jun. 1, 2017

(65) Prior Publication Data

US 2017/0265342 A1 Sep. 14, 2017

Related U.S. Application Data

(63) Continuation of application No. 13/578,364, filed as application No. PCT/JP2012/001464 on Mar. 2, 2012, now Pat. No. 9,706,695.

(30) Foreign Application Priority Data

Jul. 28, 2011 (JP) .................................. 2011-164975

(51) Int. Cl.
*H05K 13/04* (2006.01)

(52) U.S. Cl.
CPC ...... *H05K 13/0452* (2013.01); *H05K 13/0411* (2018.08); *H05K 13/0434* (2013.01); *Y10T 29/4913* (2015.01); *Y10T 29/53174* (2015.01)

(58) Field of Classification Search
CPC ........... H05K 13/0417; H05K 13/0434; H05K 13/0452; Y10T 29/4913; Y10T 29/53174
See application file for complete search history.

(56) References Cited

U.S. PATENT DOCUMENTS 4,951,383 A 8/1990 Amao
6,342,916 B1 * 1/2002 Kashiwagi ......... H05K 13/0413
348/87

(Continued)

FOREIGN PATENT DOCUMENTS

CN 1767760 A 5/2006
JP 09-186496 A 7/1997

(Continued)

OTHER PUBLICATIONS

International Search Report for application PCT/JP2012/001464 dated Apr. 3, 2012.

(Continued)

*Primary Examiner* — Livius R. Cazan
(74) *Attorney, Agent, or Firm* — Pearne & Gordon LLP (57) ABSTRACT

In an electronic component mounting system 1 configured by coupling electronic component mounting devices M1 to M4A each having a first substrate transport mechanism 12A and a second substrate transport mechanism 12B together, the electronic component mounting device M4A includes a first tray feeder 20A that stores an electronic component extracted by a first mounting head 15A of a component mounting mechanism as a first work operation mechanism, and a second tray feeder 20B that stores an electronic component extracted by a second mounting head 15B of a (Continued)

component mounting mechanism as a second work operation mechanism.

3 Claims, 9 Drawing Sheets

(56) References Cited

U.S. PATENT DOCUMENTS

| | | |
|---|---|---|
| 6,524,052 B1 | 2/2003 | Yamauchi |
| 6,616,401 B2 * | 9/2003 | Nakamura ............ B65G 47/901 198/341.05 |
| 6,971,157 B1 * | 12/2005 | Yoshida ............. H05K 13/0452 29/720 |
| 2001/0030298 A1 * | 10/2001 | Sakaguchi ............. H05K 13/08 250/559.29 |
| 2010/0325860 A1 * | 12/2010 | Maenishi ............... H05K 13/08 29/407.01 |
| 2011/0023294 A1 | 2/2011 | Awata et al. |
| 2011/0179638 A1 | 7/2011 | Nagao |

FOREIGN PATENT DOCUMENTS

| | | |
|---|---|---|
| JP | 2009-252926 A | 10/2009 |
| JP | 2010-087447 A | 4/2010 |
| JP | 2010-135364 A | 6/2010 |
| WO | 2009/104410 A2 | 8/2009 |
| WO | WO 2009104410 A2 * | 8/2009 ............ H05K 13/08 |

OTHER PUBLICATIONS

Chinese Office Action issued in Chinese Patent Application No. 201710149904 dated Dec. 26, 2018.

* cited by examiner

ELECTRONIC COMPONENT MOUNTING SYSTEM AND ELECTRONIC COMPONENT MOUNTING METHOD

TECHNICAL FIELD

The present invention relates to an electronic component mounting system and an electronic component mounting method for mounting an electronic component on a substrate to manufacture a mounting substrate.

BACKGROUND ART

An electronic component mounting system that mounts an electronic component on a substrate to manufacture a mounting substrate is configured by coupling a plurality of component mounting devices that execute a variety of component mounting related-works such as component mounting or inspection together, on substrates on which a solder joint paste has been printed. As the component mounting device of this type, there has been known a configuration having two substrate transport mechanisms and two work operation mechanisms corresponding to the respective substrate transport mechanisms, individually (Patent Literature 1). Substrate transport lanes formed by coupling the substrate transport mechanisms in the respective component mounting devices together are combined with corresponding work operation mechanisms to configure mounting lanes in which a work for mounting the substrate on the substrate is executed while transporting the substrate. A given work is executed on the substrates, which are transported by the respective substrate transport mechanisms, by the corresponding work operation mechanisms so as to produce a plurality of substrates at the same time, resulting in an advantage that the productivity is improved.

CITATION LIST

Patent Literature

Patent Literature 1: JP-A-2010-87447

SUMMARY OF THE INVENTION

Problems to be Solved by the Invention

Components to be mounted include large-sized components such as a BGA (ball grid array), and a tray feeder is required for the purpose of supplying those large-sized components. However, in the conventional art, a component mounting module having a plurality of tray feeders corresponding to each of the two substrate transport mechanisms has not generally been used. For that reason, when the plurality of component mounting devices each having the two substrate transport mechanisms are coupled to each other to configure the component mounting system, it is difficult to employ a configuration in which a plurality of tray feeders corresponding to the respective substrate transport mechanisms are arranged. As a result, when the substrates on which the components stored on the tray feeder are to be mounted are produced by using the electronic component mounting system, no restriction can be prevented.

Under the circumstances, the present invention aims at providing an electronic component mounting system having a plurality of substrate transport mechanisms and an electronic component mounting method, which can produce the substrates on which the electronic components stored in the tray feeder are to be mounted by any substrate transport mechanisms without any restriction.

Means for Solving the Problems

According to the present invention, there is provided an electronic component mounting system configured by coupling a plurality of component mounting devices that each conduct a component mounting work for mounting an electronic component on a substrate together, in which each of the component mounting devices includes a first substrate transport mechanism and a second substrate transport mechanism each transporting the substrate delivered from an upstream device in a substrate transport direction, and having a substrate holding unit that positions and holds the substrate; and a first work operation mechanism and a second work operation mechanism that are disposed in correspondence with the first substrate transport mechanism and the second substrate transport mechanism, respectively, and each execute a given work operation on the substrate held by the substrate holding unit, in which at least one of the component mounting devices is an electronic component mounting device that includes a first tray feeder that stores the electronic component extracted by a mounting head of a component mounting mechanism as the first work operation mechanism, and a second tray feeder that stores the electronic component extracted by a mounting head of a component mounting mechanism as the second work operation mechanism.

According to the present invention, there is provided an electronic component mounting method for mounting an electronic component on a substrate by an electronic component mounting system configured by coupling a plurality of component mounting devices that each conduct a component mounting work together, in which each of the component mounting devices includes a first substrate transport mechanism and a second substrate transport mechanism each transporting the substrate delivered from an upstream device in a substrate transport direction, and having a substrate holding unit that positions and holds the substrate; and a first work operation mechanism and a second work operation mechanism that are disposed in correspondence with the first substrate transport mechanism and the second substrate transport mechanism, respectively, and each execute a given work operation on the substrate held by the substrate holding unit, in which at least one of the component mounting devices is an electronic component mounting device including a first tray feeder that stores the electronic component extracted by a mounting head of a component mounting mechanism as the first work operation mechanism, and a second tray feeder that stores the electronic component extracted by a mounting head of a component mounting mechanism as the second work operation mechanism.

Advantageous Effects of Invention

According to the present invention, in the electronic component mounting system configured by coupling the plurality of component mounting devices each having the plurality of substrate transport mechanisms together, at least one of the component mounting devices is the electronic component mounting device that includes the first tray feeder that stores the electronic component extracted by the mounting head of the component mounting mechanism as the first work operation mechanism, and the second tray feeder that stores the electronic component extracted by the mounting head of the component mounting mechanism as the second work operation mechanism. As a result, the substrates on which the electronic components stored in the tray feeder are to be mounted can be produced by any substrate transport mechanisms without any restriction.

DESCRIPTION OF EMBODIMENTS

First Embodiment

Figure 1:
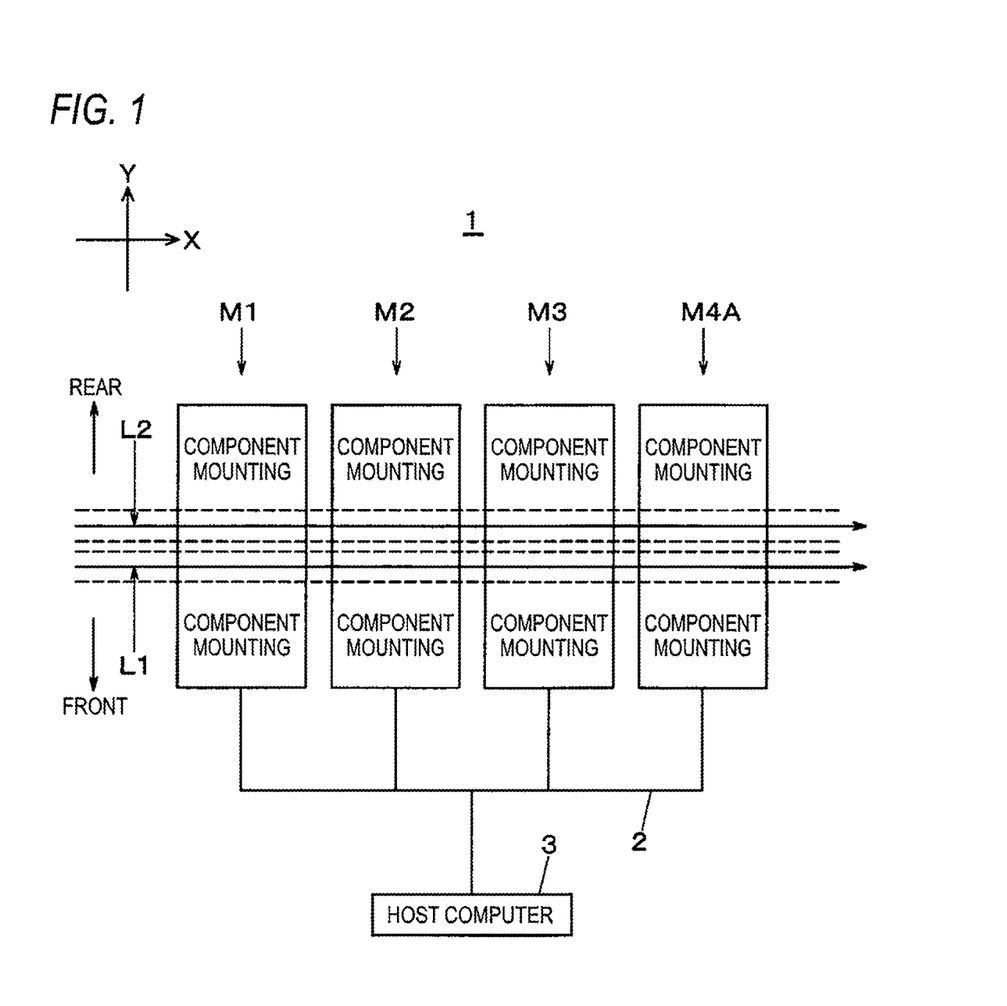
FIG. 1 is an illustrative view of a configuration of an electronic component mounting system according to a first embodiment of the present invention.

Now, embodiments of the present invention will be described with reference to the drawings. First, a configuration of an electronic component mounting system will be described with reference to FIG. 1. An electronic component mounting system 1 has a function of manufacturing a mounting substrate on which an electronic component has been mounted. The electronic component mounting system 1 is configured by coupling electronic component mounting devices M1 to M4A together in a substrate transport direction (X-direction). The coupling electronic component mounting devices M1 to M4A are component mounting devices that each conduct a component mounting work for mounting the electronic component on the substrate on which an electronic component joint paste has been printed, which is supplied from an upstream side (left side in FIG. 1). Those respective devices are connected to a host computer 3 through a LAN system 2, and the host computer 3 generally controls the component mounting work of the respective devices in the electronic component mounting system 1.

Figure 2:
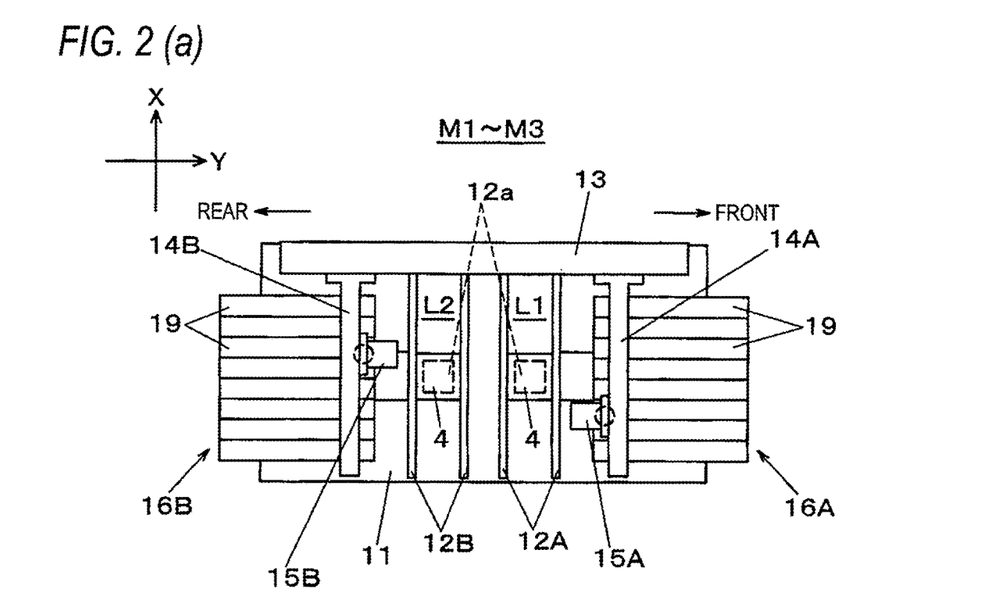
FIGS. 2(a) and 2(b) are illustrative views of one configuration of an electronic component mounting device in the electronic component mounting system according to the first embodiment of the present invention.
Figure 3:
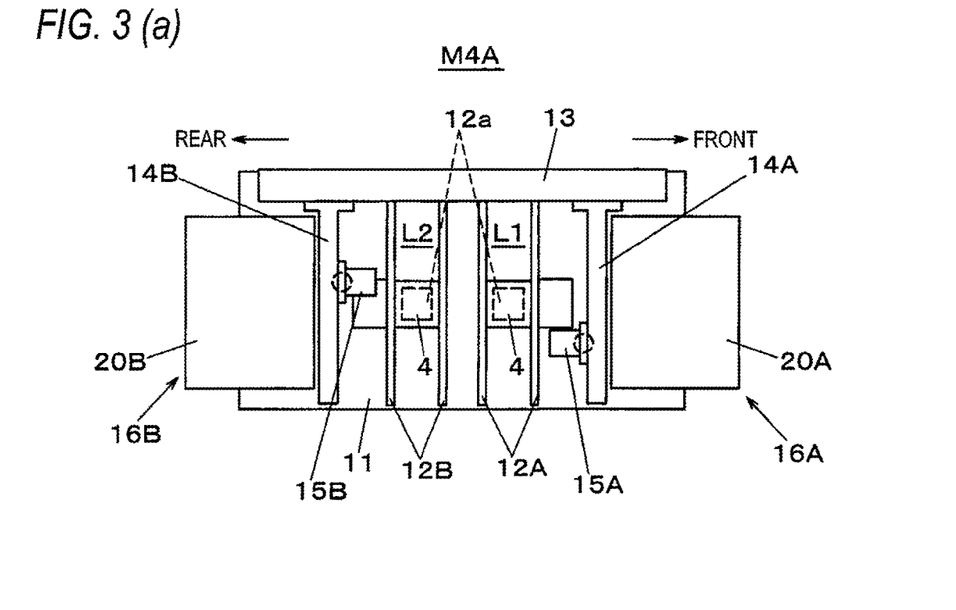
FIGS. 3(a) and 3(b) are illustrative views of another configuration of the electronic component mounting device in the electronic component mounting system according to the first embodiment of the present invention.

Each of the electronic component mounting devices M1 to M4A is equipped with a plurality of (two in this example) substrate transport mechanisms each transporting substrates 4 (refer to FIGS. 2(a) and 2(b)) delivered from an upstream device in the substrate transport direction, individually, and having a substrate holding unit (refer to a substrate holding unit 12a illustrated in FIGS. 2(a) and 3(a)) that positions and holds those substrates 4. Also, each of the electronic component mounting devices M1 to M4A is equipped with a plurality of (two in this example) work operation mechanisms as component mounting mechanisms corresponding to the respective substrate transport mechanisms. Accordingly, in each of the electronic component mounting devices M1 to M4A, the component mounting work can be executed on the substrates 4 that have been transported by the respective substrate transport mechanisms and positioned and held by the substrate holding units by the corresponding work operation mechanisms concurrently. Also, the substrates 4 that have been positioned and held by the substrate holding units of the plurality of substrate transport mechanisms can be sequentially subjected to the work by one work operation mechanism.

Substrate transport lanes formed by coupling substrate transport mechanisms in the respective electronic component mounting devices M1 to M4A together are combined with corresponding work operation mechanisms to configure mounting lanes in which a work for mounting the substrates 4 on the substrate is executed while transporting the substrates 4. In the electronic component mounting system 1 according to this embodiment, since the respective devices have the two substrate transport mechanisms, two individual first mounting lane L1 (front mounting lane) and second mounting lane L2 (rear mounting lane) are formed. That is, each of the electronic component mounting devices M1 to M4A configuring the electronic component mounting system 1 includes a plurality of substrate transport mechanisms each transmitting the substrates 4 delivered from an upstream device, and having a substrate holding unit that positions and holds the substrates 4, and a plurality of work operation mechanisms that are disposed in correspondence with the respective substrate transport mechanisms, and execute a given work operation on the substrates 4 held by the substrate holding unit.

Subsequently, a configuration of the electronic component mounting devices M1 to M3 will be described with reference to FIGS. 2(a) and 2(b). The electronic component mounting devices M1 to M3 are identical in structure with each other. Referring to FIG. 2(a), a first substrate transport mechanism 12A and a second substrate transport mechanism 12B, which configure a first mounting lane L1 and a second mounting lane L2, respectively, are arranged in the center of an upper surface of a base 11 in an X-direction. The first substrate transport mechanism 12A and the second substrate transport mechanism 12B each have a function of receiving and transporting the substrates 4 carried out of a downstream device. Also, the first substrate transport mechanism 12A and the second substrate transport mechanism 12B each have a base holding unit 12a, and the transported substrates 4 are positioned and held at work positions in the electronic component mounting devices M1 to M3 by the base holding units 12a.

A first component supply unit 16A and a second component supply unit 16B that supply the electronic components to be mounted are disposed on both sides of the base 11. In each of the first component supply unit 16A and the second component supply unit 16B is arranged a carriage 17 equipped with a plurality of tape feeders 19. Each carriage 17 is loaded with tape supply reels 18 on each of which a carrier tape T holding the electronic component to be mounted is wound and stored, in correspondence with the respective tape feeders 19. Each of the tape feeders 19 pitch-feeds the carrier tape T extracted from the tape supply reel 18, to thereby supply the electronic components to an extraction position by component mounting mechanisms which will be described below.

A Y-axial travel table 13 is arranged in a Y-direction on the upper surface of the base 11 on a downstream end in the X-direction. The Y-axial travel table 13 is equipped with a first X-axial travel table 14A and a second X-axial travel table 14B. As illustrated in FIG. 2B, the first X-axial travel table 14A and the second X-axial travel table 14B are slidable in the Y-direction along guide rails 13a arranged on a lateral surface of the Y-axial travel table 13, and driven in the Y-direction by a linear motor mechanism equipped in the Y-axial travel table 13. The first X-axial travel table 14A and the second X-axial travel table 14B are equipped with a first mounting head 15A and a second mounting head 15B as work heads through X-axial travel mounting bases, respectively. The first mounting head 15A and the second mounting head 15B are driven in the X-direction by linear motor mechanisms equipped in the first X-axial travel table 14A and the second X-axial travel table 14B, respectively. The Y-axial travel table 13, the first X-axial travel table 14A, and the second X-axial travel table 14B function as head travel mechanisms for the first mounting head 15A and the second mounting head 15B.

Each of the first mounting head 15A and the second mounting head 15B is configured to have a plurality of adsorption nozzles 15a detachably mounted on a lower portion thereof. The first mounting head 15A and the second mounting head 15B travel by the head travel mechanisms, and the electronic components are extracted from the tape feeders 19 by the adsorption nozzles 15a, and transferred and mounted on the substrates 4. The first mounting head 15A, the second mounting head 15B, and the above-mentioned head travel mechanisms configure component mounting mechanisms (first component mounting mechanism, second component mounting mechanism) as a plurality of work operation mechanisms that execute the component mounting work as a work for mounting the component on the plurality of substrates 4 transported by the first substrate transport mechanism 12A and the second substrate transport mechanism 12B.

Referring to FIG. 2(b), a first component recognition camera 17A and a second component recognition camera 17B are arranged between each of the first substrate transport mechanism 12A and the second substrate transport mechanism 12B, and the tape feeders 19, respectively. The first component recognition camera 17A and the second component recognition camera 17B are located in travel routes of the first mounting head 15A and the second mounting head 15B, respectively, and image the electronic components held by the first mounting head 15A and the second mounting head 15B from below, respectively. The imaging results are subjected to recognition processing to detect a positional displacement of the electronic components held by the first mounting head 15A and the second mounting head 15B.

Subsequently, a configuration and a function of the electronic component mounting device M4A will be described with reference to FIGS. 3(a) and 3(b). In the electronic component mounting devices M1 to M3 illustrated in FIGS. 2(a) and 2(b), the electronic component mounting device M4A sets a first tray feeder 20A and a second tray feeder 20B in the first component supply unit 16A and the second component supply unit 16B, instead of the carriages 17 on each of which the tape feeders 19 are mounted, respectively.

The first tray feeder 20A and the second tray feeder 20B each have a function of supplying trays 22 in each of which a large-sized electronic component (hereinafter referred to as "tray component") is stored. As illustrated in FIG. 3(b), each of the first tray feeder 20A and the second tray feeder 20B includes a tray storage unit 21 that stores a plurality of the trays 22 held by a pallet (not shown). Each of the first tray feeder 20A and the second tray feeder 20B has a function of extracting any tray 22 from the tray storage unit 21 by a tray holding unit 23, and moving the tray 22 to each pickup position of the first mounting head 15A and the second mounting head 15B.

In the component mounting operation, each of the first mounting head 15A and the second mounting head 15B takes the tray component from each tray 22 by the adsorption nozzles 15a, and transfers and mounts the tray component onto the substrate 4 positioned and held by each substrate holding unit 12a of the first substrate transport mechanism 12A and the second substrate transport mechanism 12B. That is, the electronic component mounting device M4A is configured so that the first tray feeder 20A and the second tray feeder 20B are arranged in the first component supply unit 16A and the second component supply unit 16B corresponding to the first component mounting mechanism and the second component mounting mechanism, respectively. The configurations and the functions other than those of the first component supply unit 16A and the second component supply unit 16B are identical with those in the electronic component mounting devices M1 to M3. The component mounted substrate 4 that has been subjected to the mounting work by the electronic component mounting device M4A is carried in a reflow device (not shown) connected to a downstream side, the substrate 4 is then heated so that the electronic component and the tray component are joined to a circuit electrode of the substrate 4 by soldering.

In the configuration of the electronic component mounting system 1, the transport lane formed by coupling the first substrate transport mechanisms 12A in the respective electronic component mounting devices M1 to M4A together and the respective work operation mechanisms disposed in correspondence with the transport lane configure the first mounting lane L1. Likewise, the transport lane formed by coupling the second substrate transport mechanisms 12B in the respective electronic component mounting devices M1 to M4A together and the respective work operation mechanisms disposed in correspondence with the transport lane configure the second mounting lane L2.

In the configuration of the above-mentioned electronic component mounting devices M1 to M4A which are the component mounting devices in this embodiment, each of those devices includes a plurality of substrate transport mechanisms (first substrate transport mechanism 12A and second substrate transport mechanism 12B) each transmitting the substrate 4 delivered from an upstream device in the substrate transporting direction, and having the substrate holding unit 12a that positions and holds the substrate 4, and a plurality of work operation mechanisms (first work operation mechanism, second work operation mechanism) that are disposed in correspondence with those respective substrate transport mechanisms, and each execute a given work operation on the substrate 4 held by the substrate holding unit 12a.

In the above-mentioned configuration, one work operation mechanism is disposed in correspondence with each of those two substrate transport mechanisms. In the configuration of those work operation mechanisms, the first mounting head 15A and the second mounting head 15B can travel above those two substrate transport mechanisms by the Y-axial travel table 13 shared by a pair of work operation mechanisms. From this fact, the substrates 4 that can be worked by the respective work operation mechanisms are not always limited to the substrates 4 positioned and held by the substrate transport mechanisms corresponding to the work operation mechanisms.

For that reason, in the electronic component mounting system 1 according to this embodiment, in the respective electronic component mounting devices M1 to M4A, the plurality of substrate transport mechanisms and the plurality of work operation mechanisms are controlled by a control unit 41 (refer to FIG. 4), to thereby selectively execute two work modes that will be described later. That is, the control unit 41 selectively executes a first work mode (so-called independent work mode) for allowing one work operation mechanism to execute the work operation on only the substrate 4 held by the substrate holding unit 12a of the substrate transport mechanism corresponding to the one work operation mechanism for each mounting lane, independently, and a second work mode (so-called alternating work mode) for allowing one work operation mechanism to execute the work operation on all of the plurality of substrates 4 held by the first substrate transport mechanism 12A of the plurality of substrate transport mechanisms, with the respective mounting lanes to be alternately worked. This makes it possible to select a flexible production mode corresponding to the characteristics of the substrate type to be produced or the number of production lots.

Figure 4:
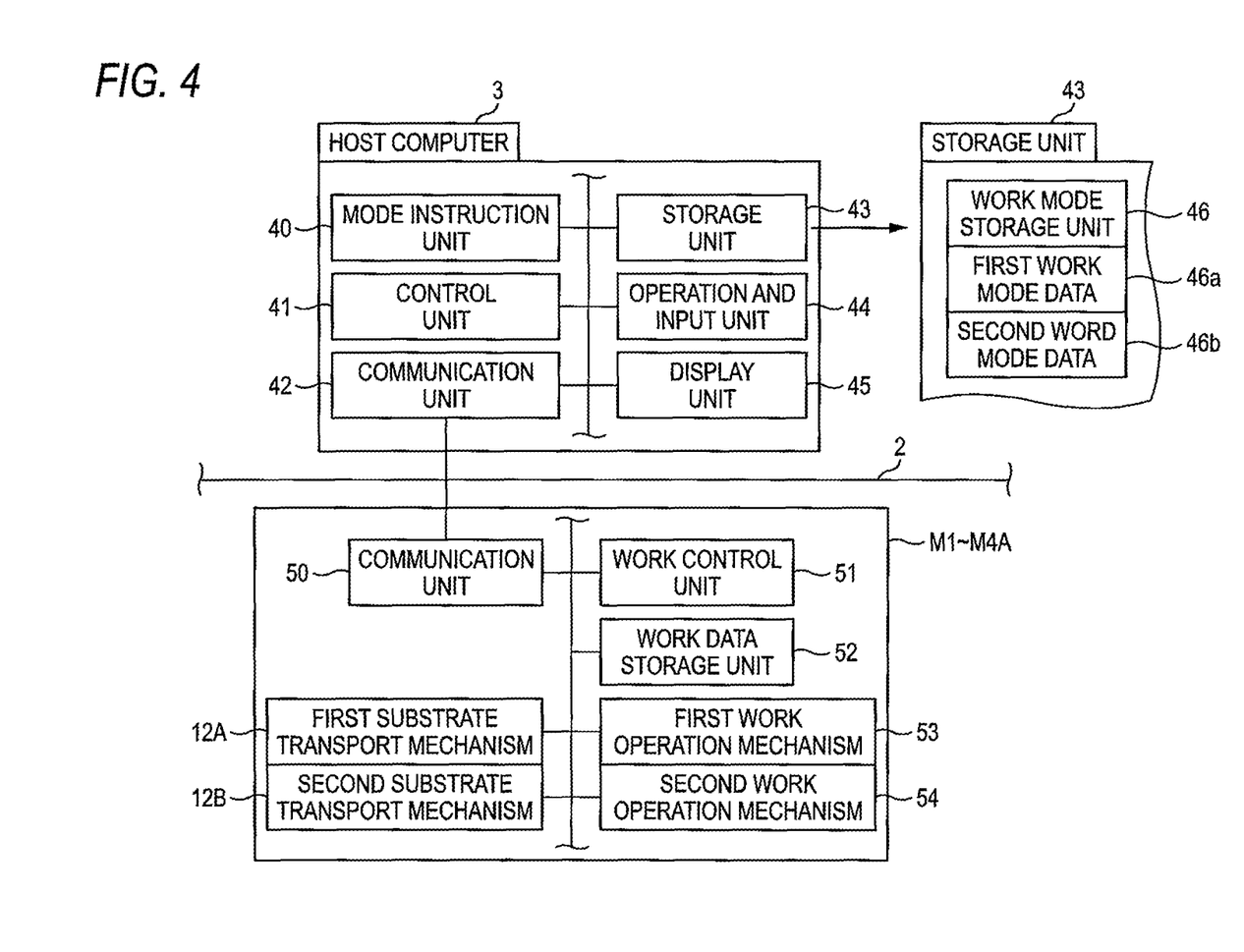
FIG. 4 is a block diagram illustrating a configuration of a control system in the electronic component mounting system according to the first embodiment of the present invention.

Subsequently, a configuration of a control system in the electronic component mounting system 1 will be described with reference to FIG. 4. Referring to FIG. 4, the host computer 3 includes a mode instruction unit 40, the control unit 41, a communication unit 42, a storage unit 43, an operation and input unit 44, and a display unit 45. The mode instruction unit 40 instructs each of the electronic component mounting devices M1 to M4A which are the component mounting devices configuring the electronic component mounting system 1 on an operation mode to be selectively executed. That is, when mode instructions are transmitted to the electronic component mounting devices M1 to M4A from the mode instruction unit 40 through the LAN system 2, the electronic component mounting devices M1 to M4A execute the work operation according to the respective designated work modes. The control unit 41 generally controls the work operation to be executed by the respective devices configuring the electronic component mounting system 1.

The communication unit 42 communicates signals with the electronic component mounting devices M1 to M4A configuring the electronic component mounting system 1 through the LAN system 2. The storage unit 43 stores work data and a work program necessary for executing the work operation on the respective types of target substrates in the respective devices of the electronic component mounting system 1, that is, data and a program for executing the electronic component mounting on the respective substrates, as well as information on the above-mentioned work modes therein. That is, the storage unit 43 includes a work mode storage unit 46, and first work mode data 46a and second word mode data 46b for executing the above-mentioned first work mode and second work mode are stored in the work mode storage unit 46.

The operation and input unit 44 is an input device such as a touch panel, and a line manager who manages the electronic component mounting system 1 inputs a variety of operation instructions to the operation and input unit 44. The operation instruction includes an instruction on the above-mentioned work modes. That is, the line manager inputs the work mode instruction through the operation and input unit 44 to instruct the work mode by the mode instruction unit 40. The display unit 45 is a display panel such as a liquid crystal panel, and displays a guide screen at the time of inputting the operation instruction, and an instruction on a setup change work required when changing the type of substrate.

Subsequently, the control system of the electronic component mounting devices M1 to M4A will be described. Each of the electronic component mounting devices M1 to M4A includes a communication unit 50, a work control unit 51, and a work data storage unit 52. The communication unit 50 is connected to the LAN system 2, and a signal and data are communicated between the electronic component mounting devices M1 to M4A, and the host computer 3. With this configuration, the work data and the work program necessary for execution of the work operation to be executed in an appropriate device among the work data stored in the storage unit 43 of the host computer 3 are written in the work data storage unit 52.

The work control unit 51 controls the first substrate transport mechanism 12A, the second substrate transport mechanism 12B, a first work operation mechanism 53, and a second work operation mechanism 54 on the basis of a mode instruction signal instructed from the mode instruction unit 40 in the host computer 3 through the LAN system 2 with reference to the work data stored in the work data storage unit 52. In this example, the first work operation mechanism 53 and the second work operation mechanism 54 are work operation mechanisms associated with the first mounting lane L1 and the second mounting lane L2, respectively. As a result, in each of the electronic component mounting devices M1 to M4A, the work operation is executed on the basis of the first work mode data 46a and the second word mode data 46b instructed from the host computer 3.

The electronic component mounting system 1 is configured as described above, and an electronic component mounting method in the electronic component mounting system 1 will be described. As described above, the electronic component mounting system 1 according to this embodiment is configured for the purpose of realizing a configuration that enhances the productivity of the substrates on which the tray components stored in the tray feeder in each of the mounting lanes are mounted. Therefore, a large number of variations are appropriately applied according to a production target in an actual applied example. Hereinafter, two kinds of examples will be described with reference to FIGS. 5(a) to 5(c) and 6(a) to 6(c).

First, an example 1 illustrated in FIGS. 5(a) to 5(c) shows an example in which the electronic component mounting system 1 is configured by the four electronic component mounting devices M1 to M3. In this example, as illustrated in FIGS. 2(a) and 2(b), each of the electronic component mounting devices M1 to M3 is an electronic component mounting device of the type in which the tape feeders 19 are equipped in both of the first component supply unit 16A and the second component supply unit 16B. As illustrated in FIGS. 3(a) and 3(b), the electronic component mounting device M4A is an electronic component mounting device of the type in which the first tray feeders 20 (20A, 20B) are equipped in both of the first component supply unit 16A and the second component supply unit 16B. That is, in the example 1, at least one of the component mounting devices configuring the electronic component mounting system 1 is the electronic component mounting device that includes the first tray feeder that stores the electronic component extracted by the mounting head of the component mounting mechanism as the first work operation mechanism, and the second tray feeder that stores the electronic component extracted by the mounting head of the component mounting mechanism as the second work operation mechanism.

Figure 5:
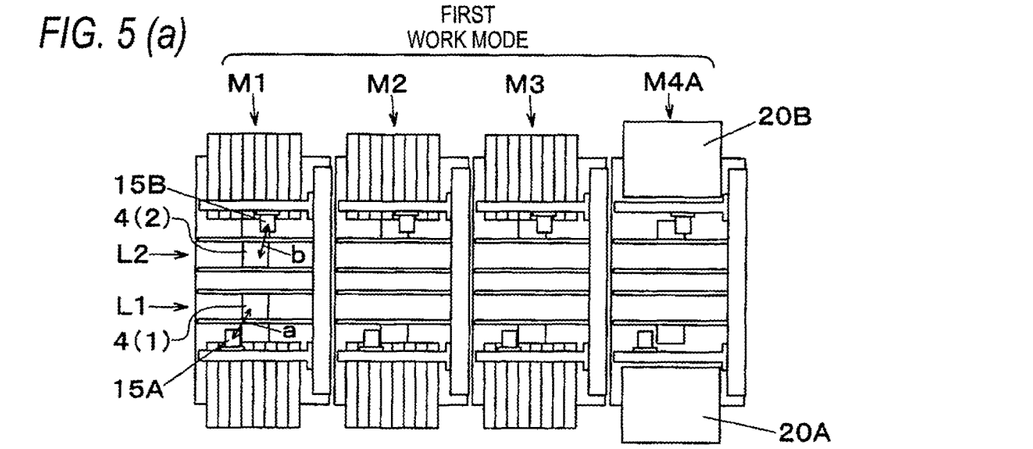
FIGS. 5(a), 5(b), and 5(c) are illustrative views of one process in an electronic component mounting method according to the first embodiment of the present invention.

In the electronic component mounting method of the electronic component mounting system 1 configured as described above, the mode instruction unit 40 in the host computer 3 instructs all of the electronic component mounting devices M1 to M4A on the first work mode as the work mode to be selectively executed. When the component mounting work starts, as shown in FIG. 5(*a*), the component mounting work is executed by the most upstream electronic component mounting device M1 according to the first work mode. This shows a case in which the substrates 4 are supplied to the first mounting lane L1 and the second mounting lane L2 with a time gap.

That is, a substrate 4(1) that is a preceding substrate is first carried in the first mounting lane L1 of the electronic component mounting device M1, and the component mounting operation is executed on the substrate 4(1) by the first mounting head 15A of the first component mounting mechanism disposed in the electronic component mounting device M1 (arrow a). Then, a substrate 4(2) that is a subsequent substrate is carried in the second mounting lane L2, independently from the component mounting work in the first mounting lane L1, and the component mounting work is executed on the substrate 4(2) by the second mounting head 15B of the second component mounting mechanism (arrow b). The substrates 4(1) and 4(2) that have been subjected to the component mounting work by the electronic component mounting device M1 are sequentially delivered to the downstream electronic component mounting devices M2 and M3. Similarly, in the electronic component mounting devices M2 and M3, the component mounting work is executed according to the first work mode.

FIG. 5(*b*) illustrates a state in which the substrate 4(1) that has been previously subjected to the component mounting work by the electronic component mounting device M3 is carried in the electronic component mounting device M4A, and the substrate 4(2), which is the subsequent substrate, still remains in the electronic component mounting device M3, and is to be worked. That is, in the second mounting lane L2 of the electronic component mounting device M3, the component mounting work is executed on the substrates 4(2) by the second mounting head 15B of the second component mounting mechanism (arrow c). Then, in the first mounting lane L1 of the electronic component mounting device M4A, the component mounting work in which the tray component taken out of the first tray feeder 20A is mounted on the substrate 4(1) is executed by the first mounting head 15A in the first component mounting mechanism (arrow d).

Subsequently, as illustrated in FIG. 5(*c*), the substrate 4(1) that has been subjected to the component mounting work in the electronic component mounting device M4A is carried out to the downstream side (arrow e). Also, the substrate 4(2) that has been subjected to the component mounting work by the electronic component mounting device M3 is carried in the electronic component mounting device M4A. Then, in the second mounting lane L2 of the electronic component mounting device M4A, the component mounting work in which the tray component taken out of the second tray feeder 20B is mounted on the substrate 4(2) is executed by the second mounting head 15B in the second component mounting mechanism (arrow f).

According to the above-mentioned example 1, the substrates on which the tray components stored in the tray feeders are to be mounted can be produced in the respective mounting lanes without any restriction. Also, in the conventional art, the component mounting device having a plurality of tray feeders in correspondence with the respective mounting lanes has not been generally used (in the conventional art, the electronic component mounting device in which the tray feeder is arranged on only one side has been generally used). Therefore, when the substrates on which the tray components stored in the tray feeders are to be mounted are intended to be produced in the respective mounting lanes by the aid of the electronic component mounting device having the two mounting lanes at the same time, the electronic component mounting device in which the tray feeder is arranged on only one side must be set to the second work mode and operated, or two of the electronic component mounting devices must be coupled with each other. However, according to the above configuration of the present invention, since the tray feeders are arranged on both sides of the electronic component mounting device, there is no need to allow the electronic component mounting device to be set to the second work mode, and operated (suppression of complicated device). Further, there is no need to couple the two electronic component mounting devices in each of which the tray feeder is arranged on only one side together. Accordingly, the facility cost can be reduced, and an area occupied by the devices can be reduced.

Figure 6:
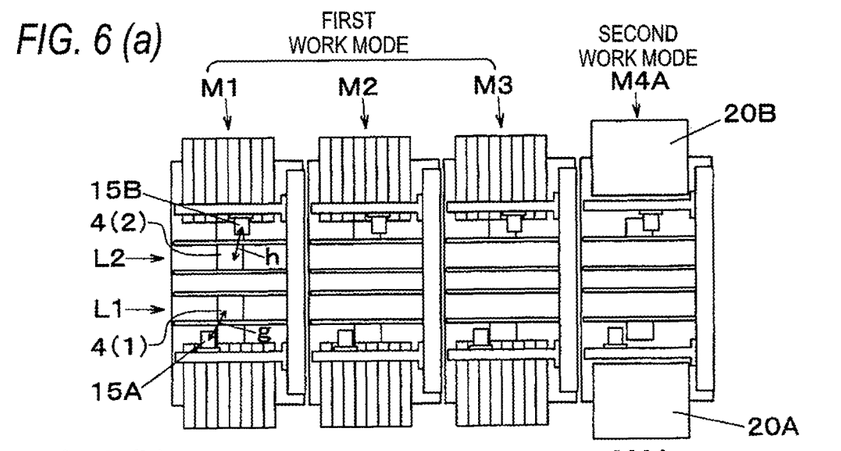
FIGS. 6(a), 6(b), and 6(c) are illustrative views of another process in the electronic component mounting method according to the first embodiment of the present invention.

In an example 2 illustrated in FIGS. 6(*a*) to 6(*c*), the mode instruction unit 40 in the host computer 3 instructs the electronic component mounting device M4A on the second work mode as the work mode to be selectively executed, and instructs the other electronic component mounting devices M1 to M3 on the first work mode as in the example 1. In the example 2, the control instruction is made for the electronic component mounting device M4A to execute the component mounting work of the second work mode on the substrate 4(1) held in the substrate holding unit 12*a* of the first substrate transport mechanism 12A, and the substrate 4(2) held in the substrate holding unit 12*a* of the second substrate transport mechanism 12B. That is, in the example 2, the mode instruction unit 40 instructs at least one electronic component mounting device on the second work mode as the work mode to be selectively executed. The first tray feeder 20A and the second tray feeder 20B are used to execute the component mounting work on the two substrates 4(1) and 4(2) held by the substrate holding units 12*a* of the first substrate transport mechanism 12A and the second substrate transport mechanism 12B, respectively.

When the component mounting work starts, as illustrated in FIG. 6(*a*), the component mounting work is executed in the first work mode by the most upstream electronic component mounting device M1. As in the example of FIGS. 5(*a*) to 5(*c*), this example shows a case in which the substrates 4 are supplied to the first mounting lane L1 and the second mounting lane L2 with a time gap. That is, the substrate 4(1) that is a preceding substrate is first carried in the first mounting lane L1 of the electronic component mounting device M1, and the component mounting operation is executed on the substrate 4(1) by the first mounting head 15A of the first component mounting mechanism disposed in the electronic component mounting device M1 (arrow g).

Then, a substrate 4(2) that is a subsequent substrate is carried in the second mounting lane L2, independently from the component mounting work in the first mounting lane L1, and the component mounting work is executed on the substrate 4(2) by the second mounting head 15B of the second component mounting mechanism (arrow h). The substrates 4(1) and 4(2) that have been subjected to the component mounting work by the electronic component mounting device M1 are sequentially delivered to the downstream electronic component mounting devices M2 and M3. Similarly, in the electronic component mounting devices M2 and M3, the component mounting work is executed according to the first work mode.

FIG. 6(b) illustrates a state in which the substrate 4(1) that has been previously subjected to the component mounting work by the electronic component mounting device M3 is carried in the electronic component mounting device M4A, and the substrate 4(2), which is the subsequent substrate, still remains in the electronic component mounting device M3, and is to be worked. That is, in the second mounting lane L2 of the electronic component mounting device M3, the component mounting work is executed on the substrates 4(2) by the second mounting head 15B of the second component mounting mechanism (arrow i). Then, in the first mounting lane L1 of the electronic component mounting device M4A, the component mounting work in which the tray component taken out of the first tray feeder 20A is mounted on the substrate 4(1) is executed by the first mounting head 15A in the first component mounting mechanism (arrow j). Alternatively with the above component mounting work, the component mounting work in which the tray component taken out of the second tray feeder 20B is mounted on the substrate 4(1) is executed by the second mounting head 15B of the second component mounting mechanism (arrow k).

Subsequently, as illustrated in FIG. 6(c), the substrate 4(1) that has been subjected to the component mounting work in the electronic component mounting device M4A is transported to the downstream side, and carried out to the downstream side (arrow l). Also, the substrate 4(2) that has been subjected to the component mounting work by the electronic component mounting device M3 is carried in the electronic component mounting device M4A. Then, in the second mounting lane L2 of the electronic component mounting device M4A, the component mounting work in which the tray component taken out of the second tray feeder 20B is mounted on the substrate 4(2) is executed by the second mounting head 15B in the second component mounting mechanism (arrow m). Alternatively with the above component mounting work, the component mounting work in which the tray component taken out of the first tray feeder 20A is mounted on the substrate 4(2) is executed by the first mounting head 15A of the first component mounting mechanism (arrow n). Then, when the component mounting operation on the substrate 4(2) has been completed by the electronic component mounting device M4A, the substrate 4(2) is carried out to the downstream side as with the substrate 4(1).

According to the above-mentioned example 2, the first tray feeder 20A and the second tray feeder 20B are used for executing the component mounting work on both of the two substrates 4(1) and 4(2) held by the substrate holding units 12a of the first substrate transport mechanism 12A and the second substrate transport mechanism 12B, respectively. As a result, it is possible to increase the member of kind of tray component that are mounted on the substrate 4(1), 4(2), and the example 2 can accept a wide range of substrate types without any increase in the number of electronic component mounting devices in which the tray feeders are arranged.

Second Embodiment

Figure 7:
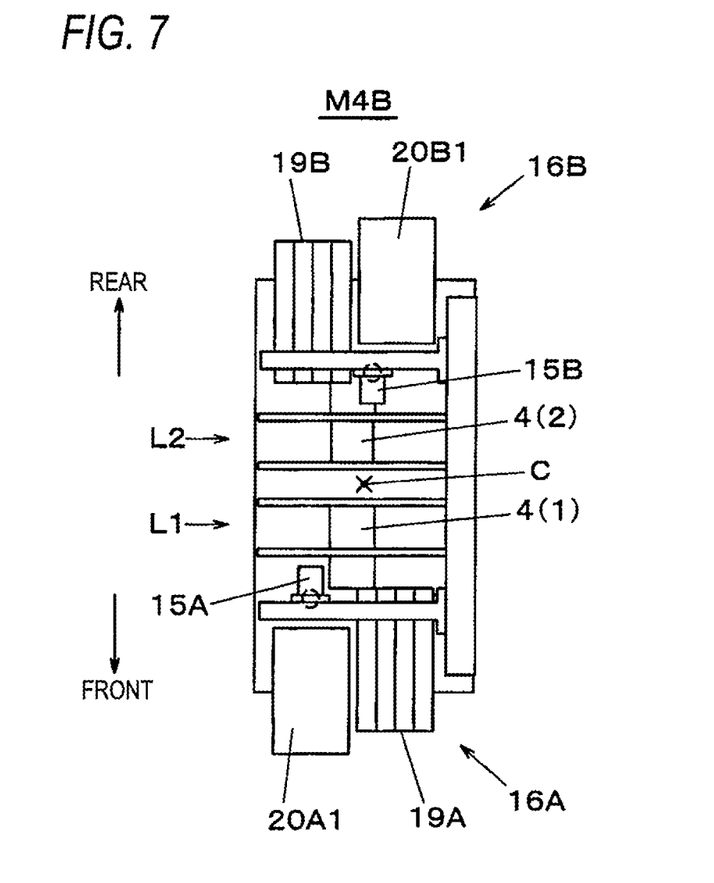
FIG. 7 is an illustrative view of a configuration of an electronic component mounting system according to a second embodiment of the present invention.

Subsequently, a component mounting system according to a second embodiment of the present invention will be described with reference to FIGS. 7, 8(a) to 8(c), and 9(a) to 9(c). In the second embodiment of the present invention, the electronic component mounting device M4A in the first embodiment is replaced with an electronic component mounting device M4B that will be described later. Referring to FIG. 7, the electronic component mounting device M4B is of a structure having a first tray feeder 20A1 and a tape feeder 19A as the parts feeder in the first component supply unit 16A, and likewise having a tape feeder 19B as the parts feeder and a second tray feeder 20B1 in the second component supply unit 16B. The first tray feeder 20A1 and the second tray feeder 20B1 are disposed point-symmetrically with respect to a center C of the electronic component mounting device M4B in a plan view. The other configurations are identical with those in the electronic component mounting device M4A, and therefore a description thereof will be omitted.

Subsequently, a description will be given of an electronic component mounting method in the electronic component mounting system including the electronic component mounting device M4B. As in the first embodiment, a large number of variations are appropriately applied according to a production target even in the electronic component mounting method of the electronic component mounting system according to the second embodiment. Hereinafter, two kinds of examples will be described with reference to FIGS. 8(a) to 8(c) and 9(a) to 9(c).

Figure 8:
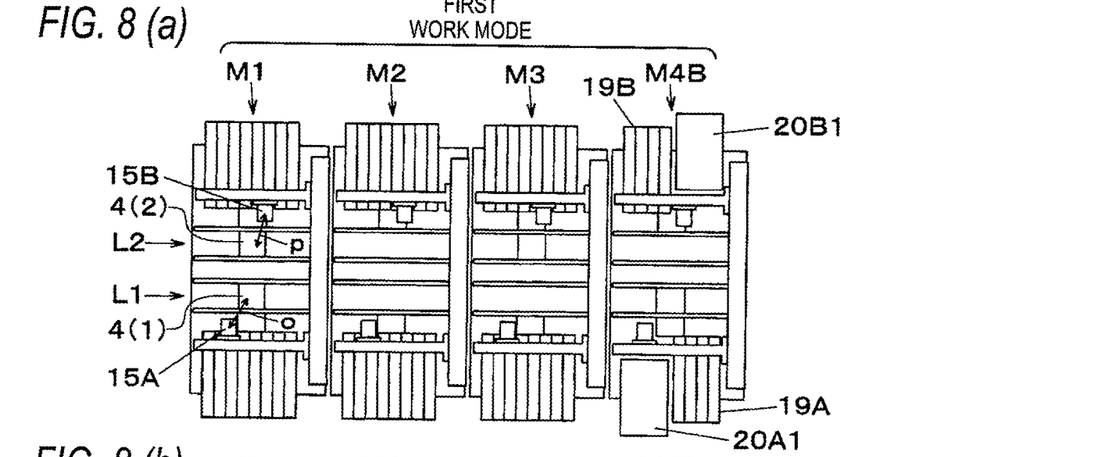
FIGS. 8(a), 8(b), and 8(c) are illustrative views of one process in an electronic component mounting method according to the second embodiment of the present invention.

First, an example 3 illustrated in FIGS. 8(a) to 8(c) shows an example in which the electronic component mounting system 1 is configured by the four electronic component mounting devices M1 to M4B. In this example, as illustrated in FIGS. 2(a) and 2(b), each of the electronic component mounting devices M1 to M3 is of the type in which the tape feeders 19 are equipped in both of the first component supply unit 16A and the second component supply unit 16B. Also, as illustrated in FIG. 7, the electronic component mounting device M4B is of the type in which the first tray feeders 20A1 and the tape feeder 19A are equipped in both of the first component supply unit 16A, the tape feeder 19B and the second tray feeder 20B1 are likewise equipped in the second component supply unit 16B, and the electronic component mounting device M4B is disposed point-symmetrically with respect to the center C of the electronic component mounting device M4B in a plan view. That is, in the second embodiment of the present invention, the first tray feeder 20A1 and the second tray feeder 20B1 are equipped together with the parts feeders of the different type, and at least one of the component mounting devices is disposed point-symmetrically with respect to the center of the electronic component mounting device in a plan view.

In the electronic component mounting method in the electronic component mounting system 1 configured as described above, the mode instruction unit 40 in the host computer 3 first instructs all of the electronic component mounting devices M1 to M4B on the first work mode as the work mode to be selectively executed. Then, when the component mounting work starts, as illustrated in FIG. 8(a), the component mounting work is executed according to the first work mode by the most upstream electronic component mounting device M1. This example shows a case in which the substrates 4 are supplied to the first mounting lane L1 and the second mounting lane L2 with a time gap as in the examples 1 and 2.

That is, the substrate 4(1) that is a preceding substrate is first carried in the first mounting lane L1 of the electronic component mounting device M2, and the component mounting work is executed on the substrate 4(1) by the first mounting head 15A of the first component mounting mechanism disposed in the electronic component mounting device M1 (arrow o). Then, the substrate 4(2) that is a subsequent substrate is carried in the second mounting lane L2, independently from the component mounting work in the first mounting lane L1, and the component mounting work is executed on the substrate 4(2) by the second mounting head 15B of the second component mounting mechanism (arrow p). The substrates 4(1) and 4(2) that have been subjected to the component mounting work by the electronic component mounting device M1 are sequentially delivered to the downstream electronic component mounting devices M2 and M3.

Similarly, in the electronic component mounting devices M2 and M3, the component mounting work is executed according to the first work mode.

FIG. 8(b) illustrates a state in which the substrate 4(1) that has been previously subjected to the component mounting work by the electronic component mounting device M3 is carried in the electronic component mounting device M4B, and the substrate 4(2), which is the subsequent substrate, still remains in the electronic component mounting device M3, and is to be worked. That is, in the second mounting lane L2 of the electronic component mounting device M3, the component mounting work is executed on the substrates 4(2) by the second mounting head 15B of the second component mounting mechanism (arrow q). Then, in the first mounting lane L1 of the electronic component mounting device M4B, the component mounting work in which the tray component taken out of the first tray feeder 20A1 is mounted on the substrate 4(1) is executed by the first mounting head 15A in the first component mounting mechanism (arrow r). Then, the component mounting work in which the electronic component taken out of the tape feeder 19A is mounted on the substrate 4(1) is executed by the first mounting head 15A (arrow s).

Subsequently, as illustrated in FIG. 8(c), the substrate 4(1) that has been subjected to the component mounting work in the electronic component mounting device M4B is carried out to the downstream side (arrow t). Also, the substrate 4(2) that has been subjected to the component mounting work by the electronic component mounting device M3 is carried in the electronic component mounting device M4B. Then, in the second mounting lane L2 of the electronic component mounting device M4B, the component mounting work in which the electronic component taken out of the tape feeder 19B is mounted on the substrate 4(2) is executed by the second mounting head 15B in the second component mounting mechanism (arrow u). Then, the component mounting work in which the electronic component taken out of the second tray feeder 20B1 is mounted on the substrate 4(2) is executed by the second mounting head 15B (arrow v). The order of the mounting work of the tray components stored in the tray feeders 20A1 and 20B1 and the mounting work of the electronic components stored in the tape feeders 19A and 19B may be reverse.

According to the above-mentioned example 3, the first tray feeder 20A1 and the second tray feeder 20B1 are disposed together with the parts feeders of the different type, and the electronic component mounting device M4B is disposed point-symmetrically with respect to the center C of the electronic component mounting device in a plan view. Therefore, a front side and a rear side of the electronic component mounting device M4B can be produced by the same drawing, as a result of which the manufacture costs of the electronic component mounting device M4B can be reduced.

Figure 9:
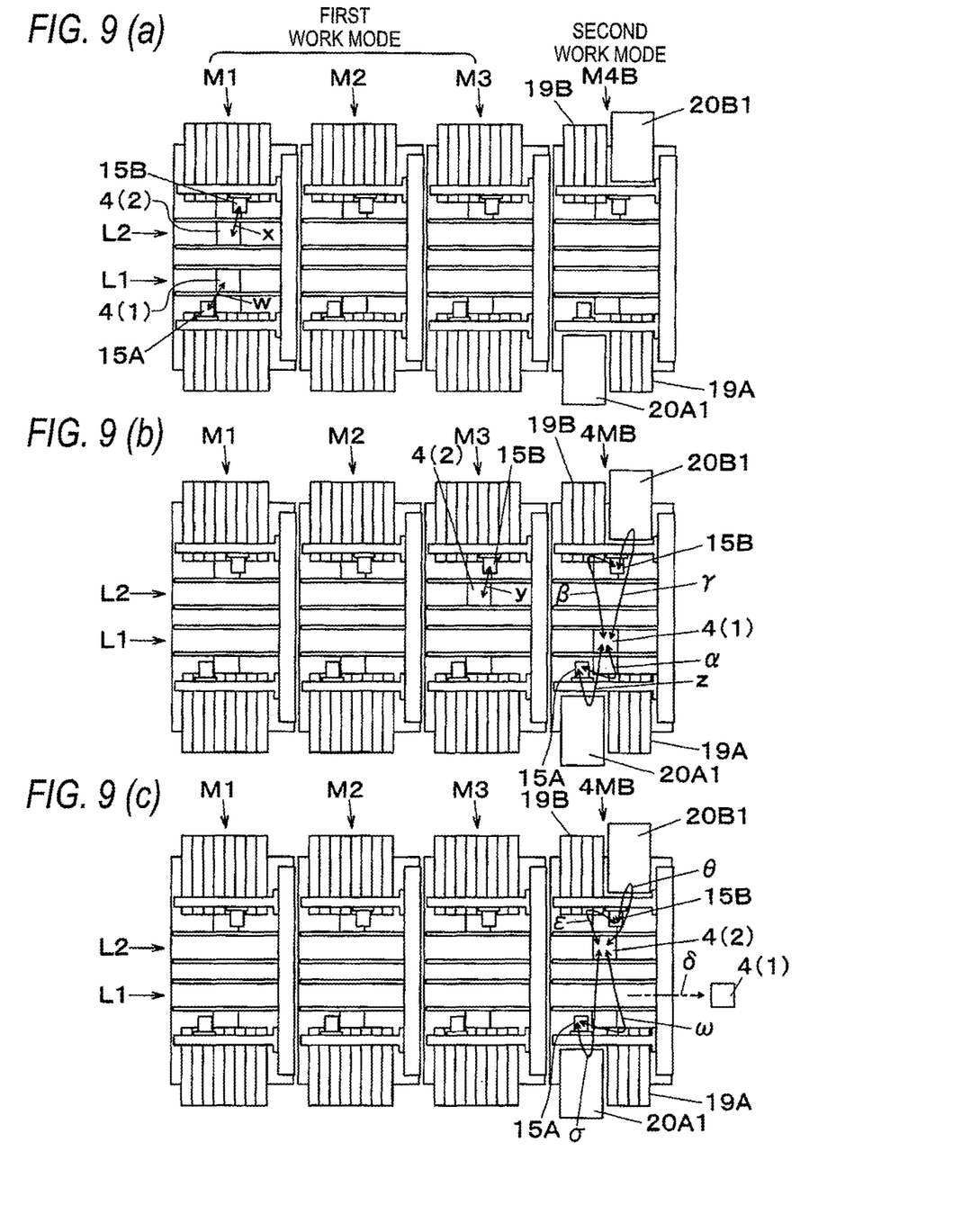
FIGS. 9(a), 9(b), and 9(c) are illustrative views of another process in the electronic component mounting method according to the second embodiment of the present invention.

In an example 4 illustrated in FIGS. 9(a) to 9(c), the mode instruction unit 40 in the host computer 3 instructs the electronic component mounting device M4B on the second work mode as the work mode to be selectively executed, and instructs the other electronic component mounting devices M1 to M3 on the first work mode. In the example 4, the control instruction is made for the electronic component mounting device M4B to execute the component mounting work of the second work mode on the substrate 4(1) held in the substrate holding unit 12a of the first substrate transport mechanism 12A, and the substrate 4(2) held in the substrate holding unit 12a of the second substrate transport mechanism 12B. That is, in the example 4, the mode instruction unit 40 instructs at least one electronic component mounting device on the second work mode as the work mode to be selectively executed. The first tray feeder 20A1 and the second tray feeder 20B1 as well as the tape feeder 19A and the tape feeder 19B are used to execute the component mounting work on both of the two substrates 4(1) and 4(2) held by the substrate holding units 12a of the first substrate transport mechanism 12A and the second substrate transport mechanism 12B, respectively.

When the component mounting work starts, as illustrated in FIG. 9(a), the component mounting work is executed in the first work mode by the most upstream electronic component mounting device M1. As in the examples of FIGS. 5(a) to 5(c), FIGS. 6(a) to 6(c), and FIGS. 8(a) to 8(c), this example shows a case in which the substrates 4 are supplied to the first mounting lane L1 and the second mounting lane L2 with a time gap. That is, the substrate 4(1) that is a preceding substrate is first carried in the first mounting lane L1 of the electronic component mounting device M1, and the component mounting operation is executed on the substrate 4(1) by the first mounting head 15A of the first component mounting mechanism disposed in the electronic component mounting device M1 (arrow w).

Then, the substrate 4(2) that is a subsequent substrate is carried in the second mounting lane L2, independently from the component mounting work in the first mounting lane L1, and the component mounting work is executed on the substrate 4(2) by the second mounting head 15B of the second component mounting mechanism (arrow x). The substrates 4(1) and 4(2) that have been subjected to the component mounting work by the electronic component mounting device M1 are sequentially delivered to the downstream electronic component mounting devices M2 and M3. Similarly, in the electronic component mounting devices M2 and M3, the component mounting work is executed according to the first work mode.

FIG. 9(b) illustrates a state in which the substrate 4(1) that has been previously subjected to the component mounting work by the electronic component mounting device M3 is carried in the electronic component mounting device M4B, and the substrate 4(2), which is the subsequent substrate, still remains in the electronic component mounting device M3, and is to be worked. That is, in the second mounting lane L2 of the electronic component mounting device M3, the component mounting work is executed on the substrates 4(2) by the second mounting head 15B of the second component mounting mechanism (arrow y). Then, in the first mounting lane L1 of the electronic component mounting device M4B, the component mounting work is executed on the substrate 4(1) by the first mounting head 15A in the first component mounting mechanism. More specifically, the component mounting work in which the tray component taken out of the first tray feeder 20A1 is mounted on the substrate 4(1) is executed by the first mounting head 15A (arrow z), and then the component mounting work in which the electronic component taken out of the tape feeder 19A is mounted on the substrate 4(1) is executed by the first mounting head 15A (arrow α). Alternatingly with the above component mounting work, the component mounting work is executed by the second mounting head 15B of the second component mounting mechanism. More specifically, the component mounting work in which the electronic component taken out of the tape feeder 19B is mounted on the substrate 4(1) is executed by the second mounting head 15B (arrow β), and the component mounting work in which the tray component taken out of the second tray feeder 20B1 is mounted on the substrate 4(1) is executed by the second mounting head 15B (arrow γ).

Subsequently, as illustrated in FIG. 9(c), the substrate 4(1) that has been subjected to the component mounting work in the electronic component mounting device M4B is transported to the downstream side (arrow δ). Also, the substrate 4(2) that has been subjected to the component mounting work by the electronic component mounting device M3 is carried in the electronic component mounting device M4B. Then, in the second mounting lane L2 of the electronic component mounting device M4A, the component mounting work is executed on the substrate 4(2) by the second mounting head 15B in the second component mounting mechanism. More specifically, the component mounting work in which the electronic component taken out of the tape feeder 19B is mounted on the substrate 4(2) is executed by the second mounting head 15B (arrow ε). Then, the component mounting work in which the electronic component taken out of the second tray feeder 20B1 is mounted on the substrate 4(1) is executed by the second mounting head 15B (arrow θ). Alternatingly with the above component mounting work, the component mounting work is executed by the first mounting head 15A in the first component mounting mechanism. More specifically, the component mounting work in which the electronic component taken out of the first tray feeder 20A1 is mounted on the substrate 4(1) is executed by the first mounting head 15A (arrow σ), and then the component mounting work in which the electronic component taken out of the tape feeder 19A is mounted on the substrate 4(1) is executed by the first mounting head 15A (arrow ω). The order of the mounting works on the tray components stored in the tray feeders 20 and the electronic components stored in the tape feeders 19 by the respective component supply units 16 may be reverse.

According to the above-mentioned example 4, the advantages described in the example 3 are obtained, and also the number of types of the tray components stored in the tray feeders, which are to be mounted on the substrates, and the electronic components stored in the tape feeders can be increased. Thus, the example 4 can accept a wide range of substrate types.

In the electronic component mounting system according to this embodiment as described above, which is configured by coupling a plurality of component mounting devices each having the plurality of substrate transport mechanisms together, at least one of the component mounting devices includes the first tray feeder that stores the electronic component extracted by the mounting head of the component mounting mechanism as the first work operation mechanism, and the second tray feeder that stores the electronic component extracted by the mounting head of the component mounting mechanism as the second work operation mechanism. This makes it possible to realize the electronic component mounting system that can produce the substrates on which the tray components are to be mounted in any base transport mechanism without any restriction, and is excellent in the production efficiency of the substrates on which the tray components are to be mounted.

Also, each of the first tray feeder and the second tray feeder is used to execute the component mounting work on both of the two substrates held by the base holding units of the first substrate transport mechanism and the second substrate transport mechanism, respectively. With this configuration, the number of types of the tray components to be mounted on the substrates can be increased, and this configuration can accept a wide range of substrate types without any increase in the number of electronic component mounting devices in which the tray feeders are arranged.

Further, the first tray feeder and the second tray feeder are disposed together with the parts feeders of the different type, and the electronic component mounting device is disposed point-symmetrically with respect to the center of the electronic component mounting device in a plan view. Therefore, the front side and the rear side of the electronic component mounting device can be produced by the same drawing, as a result of which the manufacture costs of the electronic component mounting device can be reduced.

According to the present invention, modifications and applications by an ordinary skilled person on the basis of the disclosure of the present specification and known techniques without departing from the subject matter and scope of the present invention are also intended by the present invention, and included in a scope to be protected. Also, the respective components in the above embodiments may be arbitrarily combined together without departing from the subject matter of the present invention.

The present invention is based on Japanese Patent Application No. 2011-164975 filed on Jul. 28, 2011 and content thereof is incorporated herein by reference.

INDUSTRIAL APPLICABILITY

The electronic component mounting system and the electronic component mounting method of the present invention can produce the substrates on which the tray components stored in the tray feeders are to be mounted, which are transported by the respective substrate transport mechanisms without any restriction, and are advantageously excellent in the production efficiency of the substrates on which the tray components are to be mounted.

DESCRIPTION OF REFERENCE NUMERALS AND SIGNS 1, electronic component mounting system
4, 4(1), 4(2), substrate
12A, first substrate transport mechanism
12B, second substrate transport mechanism
12a, substrate holding unit
15A, first mounting head
15B, second mounting head
16A, first component supply unit
16B, second component supply unit
19, 19A, 19B, tape feeder
20A, 20A1, first tray feeder
20B, 20B1, second tray feeder
M1, M2, M3, M4A, M4B, electronic component mounting device
L1, first mounting lane
L2, second mounting lane

The invention claimed is:

1. An electronic component mounting system configured by coupling a plurality of component mounting devices that each conducts a component mounting work for mounting an electronic component on a substrate, the electronic component mounting system comprising:

a mode instruction unit configured to instruct one or more of the plurality of the component mounting devices to execute a first work mode and concurrently one or more of the plurality of the component mounting devices to execute a second work mode which is different from the first work mode;

the plurality of component mounting devices, each of the component mounting devices comprising:

a first substrate transport mechanism and a second substrate transport mechanism each transporting a substrate delivered from an upstream device in a substrate transport direction, and having a substrate holding unit that positions and holds the substrate; and a first work operation mechanism and a second work operation mechanism that are disposed in correspondence with the first substrate transport mechanism and the second substrate transport mechanism, respectively, and each executes a given work operation on the substrate held by the substrate holding unit, wherein at least one of the component mounting devices serves as an electronic component mounting device that includes a first tray feeder that stores an electronic component, a second tray feeder that stores an electronic component, a first parts feeder that stores an electronic component, and second parts feeder that stores an electronic component and the at least one of the component mounting devices further comprises a first mounting head that extracts the electronic components stored in the first tray feeder and the first parts feeder as the first work operation mechanism and a second mounting head that extracts the electronic components stored in the second tray feeder and the second parts feeder as the second work operation mechanism;

wherein the first tray feeder corresponds to the first substrate transport mechanism and the second tray feeder corresponds to the second substrate transport mechanism, and the first tray feeder and the second tray feeder are disposed at diagonal positions of a base in plan view, and the first parts feeder is provided in parallel with the first tray feeder and the second parts feeder is provided in parallel with the second tray feeder, and the first parts feeder and the second parts feeder are disposed at diagonal positions of the base in plan view such that a virtual line extending between the first and second tray feeders crosses a virtual line extending between the first and second parts feeders.

2. The electronic component mounting system according to claim 1, wherein the first work operation mechanism is configured to mount an electronic component taken out from the first tray feeder on a first substrate and then mount the electronic component positioned at a first extraction position by the first parts feeder on the first substrate, wherein the second work operation mechanism is configured to mount the electronic component positioned at a second extraction position by the second parts feeder on a second substrate and then mount an electronic component taken out from the second tray feeder on the second substrate.

3. The electronic component mounting system according to claim 1, wherein the first work operation mechanism is configured to mount the electronic component positioned at a first extraction position by the first parts feeder on a first substrate after the second work operation mechanism mounts the electronic component positioned at a second extraction position by the second parts feeder on the first substrate, wherein the first work operation mechanism is configured to mount an electronic component taken out from the first tray feeder on the first substrate after the second work operation mechanism mounts an electronic component taken out from the second tray feeder on the first substrate.

* * * * *